United States Patent [19]
Kim

[11] Patent Number: 5,880,647
[45] Date of Patent: Mar. 9, 1999

[54] HIGH FREQUENCY SIGNAL GENERATOR USING SUPERCONDUCTING QUANTUM INTERFERENCE DEVICE

[75] Inventor: Hong Teuk Kim, Seoul, Rep. of Korea

[73] Assignee: LG Electronics, Inc., Seoul, Rep. of Korea

[21] Appl. No.: 700,279

[22] Filed: Aug. 20, 1996

[30] Foreign Application Priority Data

Aug. 25, 1995 [KR] Rep. of Korea .................. 1995-26598

[51] Int. Cl.⁶ ........................... H03B 15/00; H03B 19/00
[52] U.S. Cl. ...................... 333/99 S; 333/218; 327/527; 324/248; 505/204; 505/854
[58] Field of Search .................... 333/218, 995; 324/248; 327/527; 455/325, 328; 505/202, 204, 210, 854

[56] References Cited

U.S. PATENT DOCUMENTS

| | | | |
|---|---|---|---|
| 5,280,242 | 1/1994 | Odawara et al. ...................... | 324/248 |
| 5,334,884 | 8/1994 | Tesche ................................. | 324/248 X |
| 5,355,085 | 10/1994 | Igarashi et al. ........................ | 324/248 |
| 5,406,201 | 4/1995 | Kiryu et al. ........................... | 324/248 |
| 5,493,719 | 2/1996 | Smith et al. ......................... | 505/202 X |

OTHER PUBLICATIONS

Hess, Robert J.; "Low–Power MIC Diode Doubler"; *MSN & CT*; Dec. 1987; pp. 58–67; Copy in Cl 333/218.

Lincke, RA. et al; "Cryogenic Millimeter–Wave Receiver using Molecular Beam Epitoxy Diodes"; *IEEE Trans on Microwave Theory & Techniques*; MTT–26; No. 12; Dec. 1978; pp. 935–938.

*Primary Examiner*—Benny T. Lee
*Attorney, Agent, or Firm*—John P. White; Cooper & Dunham LLP

[57] ABSTRACT

A high frequency signal generator using a superconducting quantum interference device is disclosed including: a magnetic signal generator for supplying a low frequency magnetic signal to a superconducting quantum interference device; a first filter for selectively supplying only the magnetic signal to the superconducting quantum interference device, and preventing a high frequency signal generated from the superconducting quantum interference device from flowing to the magnetic signal generator; the superconducting quantum interference device for frequency-multiplying the magnetic signal generated from the first filter to the high frequency signal of a sinusoidal wave according to the frequency, waveform and amplitude of the magnetic signal; a second filter for preventing the magnetic signal generated from the magnetic signal generator from flowing to a high frequency guide and antenna, and selectively supplying only the high frequency signal generated from the superconducting quantum interference device to the high frequency guide and antenna; and the high frequency guide and antenna for transmitting the high frequency signal supplied through the second filter to the exterior.

8 Claims, 4 Drawing Sheets

HIGH FREQUENCY SIGNAL GENERATOR USING SUPERCONDUCTING QUANTUM INTERFERENCE DEVICE

BACKGROUND OF THE INVENTION

1. Field of the Invention

The present invention relates to high frequency signal generators and, more particularly, to a high frequency signal generator for frequency-multiplying a low frequency signal to a high frequency signal by using a magnetic-to-voltage multiplex characteristic of a superconducting quantum interference device.

2. Discussion of Related Art

Generally, as an apparatus for generating a high frequency wave such as a millimeter wave, a resonator having a variety of forms is connected to an active element such as a Gunn diode or a GaAs FET (field effect transistor) to generate a desired resonant frequency signal. The configuration and operation of such a high frequency signal generator will be described with reference to FIGS. 1, 2, 3A and 3B.

Referring now to FIG. 1, a resonant frequency is generated using a resonator 12 and an amplifier 11 consisting of FETs. Among signals of various frequency components generated from the amplifier 11, only a signal of a predetermined band passing the resonator 12 is continuously generated as a high frequency signal from an output terminal OUT through positive feedback.

Referring to FIG. 2, a Gunn diode 21 is used to generate the high frequency signal. Only a corresponding resonant frequency component generated from a resonator 22 among signals generated from the Gunn diode 21 is supplied to the exterior through an output terminal OUT.

FIG. 3A shows the operating principle of a high frequency signal generator using a superconducting junction. An AC effect is used indicating that if a constant voltage V is applied to a Josephson junction 30, a signal of a frequency component proportional thereto is generated. This can be expressed by the following equation:

$$I = Ic\text{Sin}\left[\frac{2\pi}{\Phi o} Vt + \phi(0)\right]$$
$$= Ic\text{Sin}[2\pi f_j t + \phi(0)]$$
$$f_j = \frac{V}{\Phi o} = \frac{2e}{h} \cdot V = 483.6 \times 10^{12} V[\text{Hz}]$$

where

Ic: superconducting critical current $\Phi o$: magnetic quantum=$h/2e$=$2.0679 \times 10^{-15}$ T-m$^2$ e: electron charge=$1.6 \times 10^{-19}$ C h: Planck's constant=$6.6262 \times 10^{-34}$ Js V: DC voltage across Josephson junction, I: AC current flowing into Josephson junction, $\phi(o)$: constant phase, and $f_j$: Josephson oscillation frequency by DC voltage.

FIG. 3B shows one example of a Josephson junction array using the above principle. If constant currents flow through a first high frequency choke coil 31A, bias lines 32, Josephson junctions 33 and a second high frequency chock coil 31B, a high frequency signal which varies linearly according to a voltage across the Josephson junction 33 is generated. If only one of the Josephson junctions 33 is used, since a power is weak, the above array structure is utilized to raise the output power.

However, the high frequency signal generator using the FET or the Gunn diode is difficult in actuality to generate a very high frequency such as a millimeter wave. Moreover, the high frequency signal generator using the AC effect of the superconducting Josephson junction also has difficulty in forming the Josephson junction under the conditions of high temperature superconductivity operated at a nitrogen temperature.

SUMMARY OF THE INVENTION

Accordingly, an object of the present invention is to provide a high frequency signal generator for frequency-multiplying a low frequency magnetic signal to a high frequency voltage signal by using a magnetic-to-voltage multiplex characteristic of a superconducting quantum interference device including a weak link junction under the conditions of high temperature superconductivity.

It is another object of the present invention to provide a high frequency signal generator using a superconducting quantum interference device which can generate a high frequency signal of superior performance by coupling a wave guide or an antenna of an appropriate structure.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the high frequency signal generator includes: a magnetic signal generator for supplying a low frequency magnetic signal to a superconducting quantum interference device; a first filter for selectively supplying only the magnetic signal to the superconducting quantum interference device, and preventing a high frequency signal generated from the superconducting quantum interference device from flowing to the magnetic signal generator; the superconducting quantum interference device for frequency-multiplying the magnetic signal generated from the first filter to the high frequency signal of a sinusoidal wave according to the frequency, waveform and amplitude of the magnetic signal; a second filter for preventing the magnetic signal generated from the magnetic signal generator from flowing to a high frequency guide and antenna, and selectively supplying only the high frequency signal generated from the superconducting quantum interference device to the high frequency guide and antenna; and the high frequency guide and antenna for transmitting the high frequency signal supplied through the second filter to the exterior.

In accordance with another aspect of the present invention, a high frequency signal generator using a superconducting quantum interference device which is connected to an antenna of a waveguide type and generates a high frequency signal according to a low frequency input current includes: a coil for receiving the low frequency input current and generating a low frequency magnetic signal; a back short part for passing the low frequency magnetic signal generated from the coil, and cutting off a high frequency signal generated from a superconducting quantum interference device array part; the superconducting quantum interference device array part for respectively receiving the low frequency magnetic signal and a bias current from the back short part and a bias current supply wire, and generating the high frequency signal corresponding to the waveform, amplitude and frequency of the low frequency magnetic signal; and a upper waveguide part for cutting off the low frequency magnetic signal generated from the coil, and transmitting only the high frequency signal to the exterior.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the drawings.

DETAILED DESCRIPTION OF THE PREFERRED EMBODIMENT

Reference will now be made in detail to the preferred embodiments of the present invention, examples of which are illustrated in the accompanying drawings.

Figure 1:
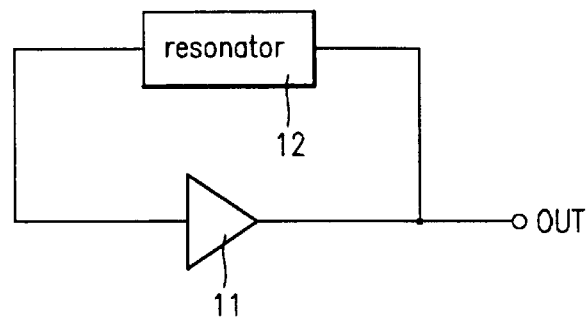
FIG. 1 is a block diagram of a conventional general high frequency signal generator for generating a resonant frequency using an amplifier and a resonator.
Figure 2:
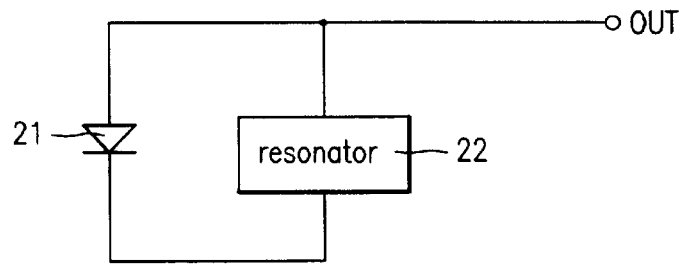
FIG. 2 is a block diagram of another conventional general high frequency generator using a Gunn diode.
Figure 3A:
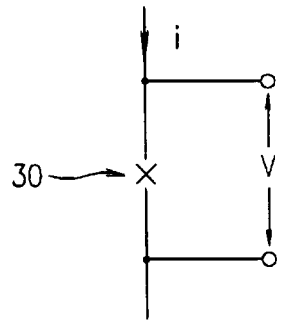
FIG. 3A is a diagram showing the operating principle of the conventional general high frequency generator using a superconducting junction including a current i and a voltage V.
Figure 3B:
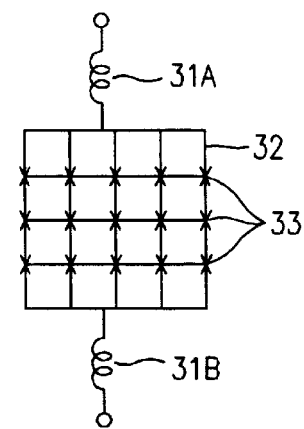
FIG. 3B is a diagram showing a conventional Josephson junction array using the principle of the superconducting junction.
Figure 4:
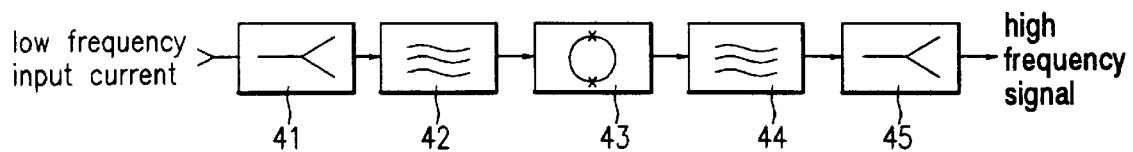
FIG. 4 is a block diagram of a high frequency signal generator using a superconducting quantum interference device according to one embodiment of the present invention.

FIG. 4 shows a high frequency signal generator using a superconducting quantum interference device. A magnetic signal generator 41 generates a magnetic signal for supplying a low frequency input current to a superconducting quantum interference device 43. A first filter 42 supplies only the magnetic signal generated from the magnetic signal generator 41 to the superconducting quantum interference device 43, and prevents a high frequency signal generated from the superconducting quantum interference device 43 from flowing to .the magnetic signal generator 41. The superconducting quantum interference device 43 converts the magnetic signal supplied through the first filter 42 into the high frequency signal of a sinusoidal wave according to the waveform, amplitude and frequency of the magnetic signal. A second filter 44 prevents the magnetic signal generated from the magnetic signal generator 41 from flowing to a high frequency guide and antenna 45, and selectively supplies only the high frequency signal generated from the superconducting quantum interference device 43 to the high frequency guide and antenna 45. The high frequency guide and antenna 45 transmits the high frequency signal supplied through the second filter 44 to the exterior.

The basic principles of the high frequency signal generator using the superconducting quantum interference device are that the stability of a frequency is high and that if a low frequency magnetic signal which is capable of generating a high output is supplied to a closed loop of the superconducting quantum interference device, the several tenth or hundredth harmonic of a basic frequency of the low frequency magnetic signal can be made to a dominant component by a magnetic quantization phenomenon of the closed loop of a superconductor and by the magnetic, current and voltage characteristics of a superconducting junction.

Referring back to FIG. 4, the magnetic signal generator 41 generates the low frequency magnetic signal. The first filter 42 blocks out the unnecessary magnetic signal except a specific magnetic signal component should be transmitted to the superconducting quantum interference device 43. Therefore, only a specific low frequency magnetic signal is supplied to the superconducting quantum interference device 43, and frequency-multiplied to the high frequency signal of the sinusoidal wave according to the waveform, amplitude and frequency of the magnetic signal. The second filter 44 causes the magnetic signal generated from the magnetic signal generator 41 not to flow to the high frequency guide and antenna 45, and selectively supplies only the high frequency signal generated from the superconducting quantum interference device 43 to the high frequency guide and antenna 45. The specific high frequency signal generated through such processes is transmitted to the exterior through the high frequency guide and antenna 45.

Figure 5A:
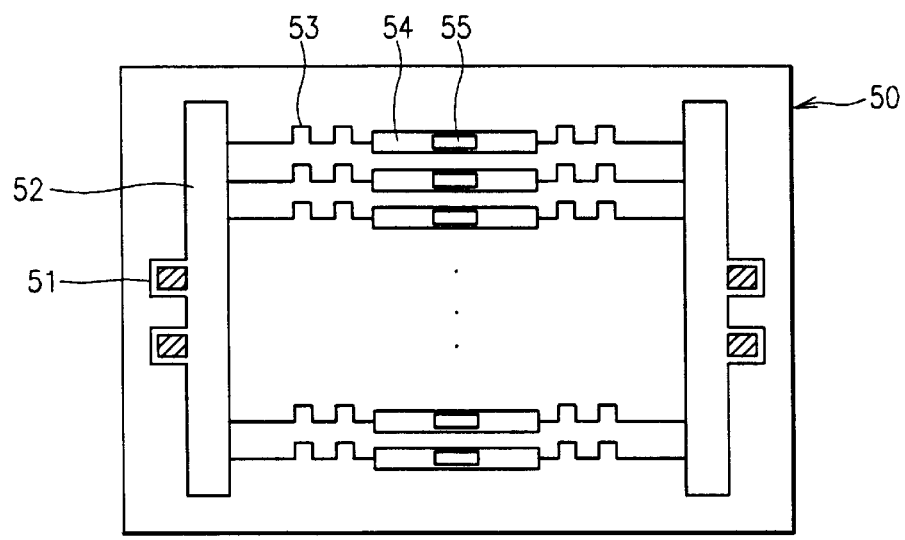
FIG. 5A is a block diagram of another high frequency signal generator using the superconducting quantum interference device according to another embodiment of the present invention.

FIG. 5A shows another high frequency generator using the superconducting quantum interference device. There is illustrated an active array antenna using the superconducting quantum interference device formed on a bi-crystal substrate. If a bias current is applied through a wire connector 51, the bias current passes a parallel connector 52 formed with a non-superconductor and is supplied to a superconducting quantum interference device 55 formed on the center of a dipole antenna 54 through a high frequency choke 53. The bias current is frequency-multiplied to the high frequency signal, and the frequency-multiplied high frequency signal is transmitted to the exterior through the dipole antenna 54.

The parallel connector 52 of the non-superconductor causes the superconducting quantum interference device 55 not to form a superconducting loop with another superconducting quantum interference device 55, and simultaneously supplies the bias current to each superconducting quantum interference device 55. The high frequency choke 53 is used not to emit the high frequency signal generated from the superconducting quantum interference device 55 to the exterior through the wire connector 51 or the parallel connector 52.

Figure 5B:
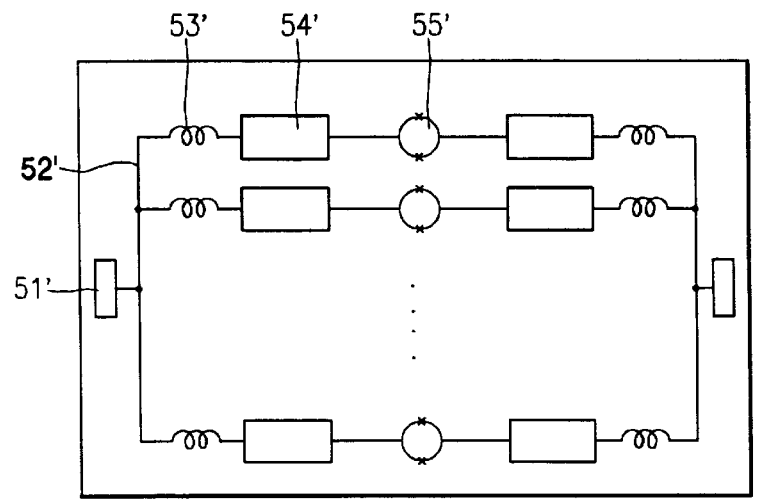
FIG. 5B is an equivalent circuit diagram of FIG. 5A.

FIG. 5B is an equivalent circuit diagram of FIG. 5A. Reference numerals 51', 52', 53', 54' and 55' designate the wire connector, parallel connector, high frequency choke, dipole antenna, and superconducting quantum interference device, respectively.

Figure 6:
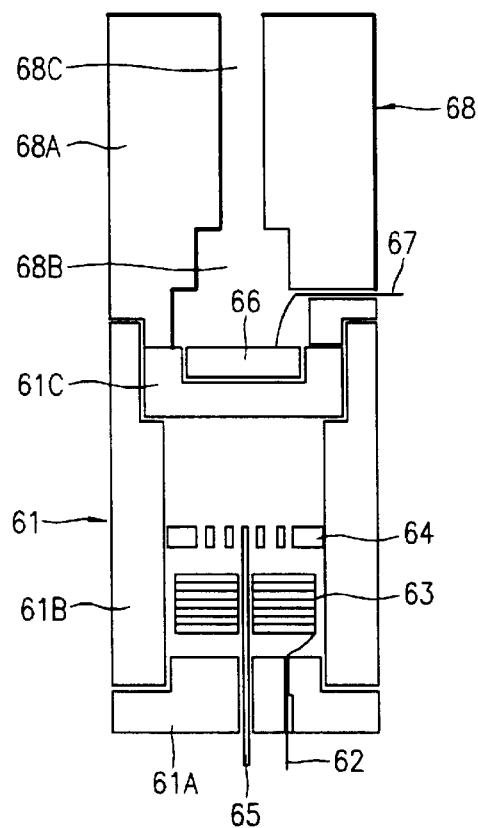
FIG. 6 is a sectional view showing a waveguide high frequency signal generator using the superconducting quantum interference device according to the present invention.

FIG. 6 illustrates a waveguide high frequency signal generator using an array of the superconducting quantum interference device shown in FIG. 5A.

A low frequency current is supplied to a coil 63 through a low frequency current supply wire 62, thereby generating a low frequency magnetic signal. The low frequency magnetic signal is supplied to a superconducting quantum interference device array part 66 through a back short part 64. In this case, a bias current is supplied to the superconducting quantum interference device array part 66 through a bias current supply wire 67. The superconducting quantum interference device array part 66 generates a high frequency signal corresponding to the waveform amplitude and frequency of the low frequency magnetic signal. This high frequency signal is transmitted to the exterior through an impedance matching part 68B and a waveguide 68C without flowing to the back by the back short part 64. The low frequency magnetic signal generated from the coil 63 is cut off by the impedance matching part 68B and the waveguide 68C formed by a upper waveguide 68A with both sides of a step structure, and only the high frequency generated from the superconducting quantum interference device array part 66 is sent to the exterior. The impedance matching part 68B matches the impedance of the high frequency signal between the superconducting quantum interference device array part 66 and a waveguide 68C, and causes the high frequency to escape from the waveguide 68C without reflecting. To generate a large quantity of single high frequency components, when frequency-multiplying the low frequency signal to the high frequency signal in the superconducting quantum interference device array part 66, a converting characteristic graph should be linear. Therefore, it is desirable to use the low frequency signal of a triangular wave form.

The back short part 64 passes the low frequency magnetic signal generated from the coil 63, and cuts off the high frequency signal generated from the superconducting quantum interference device array part 66. A better impedance matching effect can be obtained by appropriately adjusting a distance between the back short part 64 and the superconducting quantum interference device array part 66 according to the sliding operation of the back short part 64 using a back short position adjustor 65. A bottom waveguide cover 61A is used to support the low frequency current supply wire 62 and the back short position adjustor 65 and to shield a bottom waveguide 61B. In the superconducting quantum interference device array part 66 supported by an interference device supporter 61C, a plurality of superconducting quantum interference devices 55 shown in FIG. 5A is arranged to raise an output power. In a wide meaning, an antenna may be inserted in the array shown in FIG. 5A. A bottom waveguide part 61 includes the bottom waveguide cover 61A, the bottom waveguide 61B and the interference device supporter 61C. The coil 63, the back short part 64 and the back short position adjustor 65 are contained within the bottom waveguide part 61. A upper waveguide part 68 includes the upper waveguide 68A, the impedance matching part 68B and the waveguide 68C.

Figure 7:
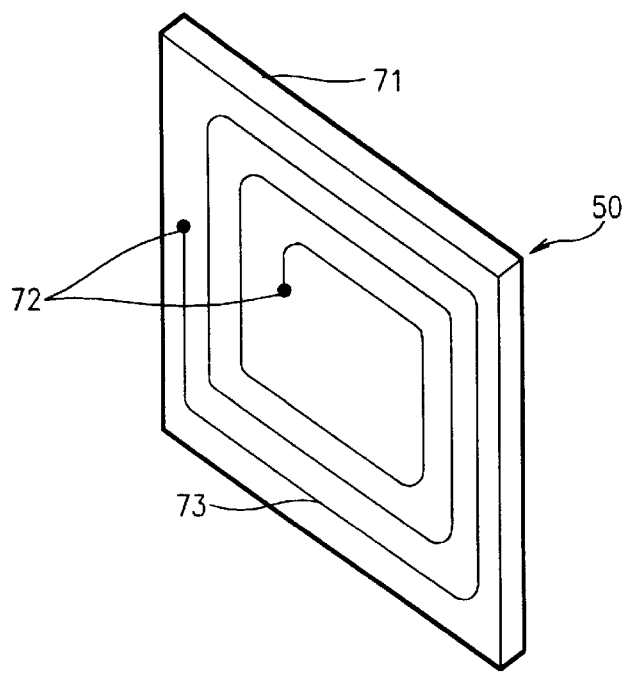
FIG. 7 is a cutaway view showing still another high frequency signal generator for generating a low frequency magnetic signal and a high frequency signal in one substrate according to the present invention.

Referring to FIG. 7, a low frequency magnetic signal supplier and a high frequency signal generator are formed on one substrate.

A coil 73 is formed at the back of a substrate 71. A low frequency current signal supplied through a wire connector 72 is generated as a magnetic signal by the coil 73. An active array antenna 50 as also shown in FIG. 5A is formed at the front of the substrate 71, and frequency-multiplies the low frequency magnetic signal generated from the coil 73 to a high frequency signal. Thus, since the low frequency magnetic signal supplier and the high frequency signal generator are formed on one substrate 71, a circuit can be simplified and miniaturized.

Figure 8A:
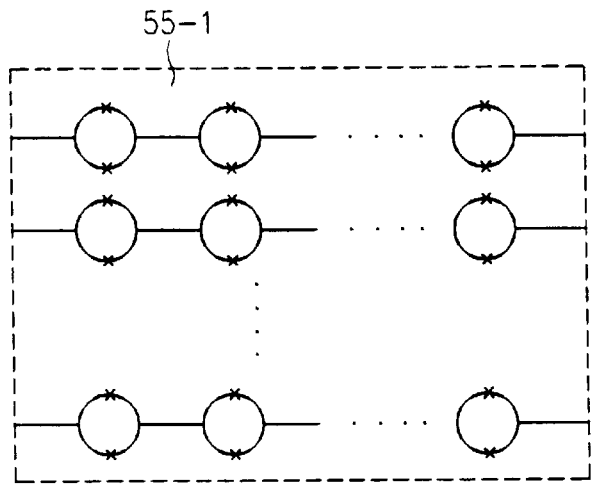
FIGS. 8A, 8B and 8C illustrate examples of a serial/parallel array structure of the superconducting quantum interference device applied to the present invention.

FIG. 8A illustrates a serial/parallel array structure of the superconducting quantum interference device. A plurality of superconducting quantum interference devices 55-1 are constructed to raise the output power. An operating resistor (not shown) of a superconducting junction is connected in series and in parallel to raise the impedance matching of the antenna. The number of superconducting junctions within a loop of one superconducting quantum interference device 55-1 is two or more.

Figure 8B:
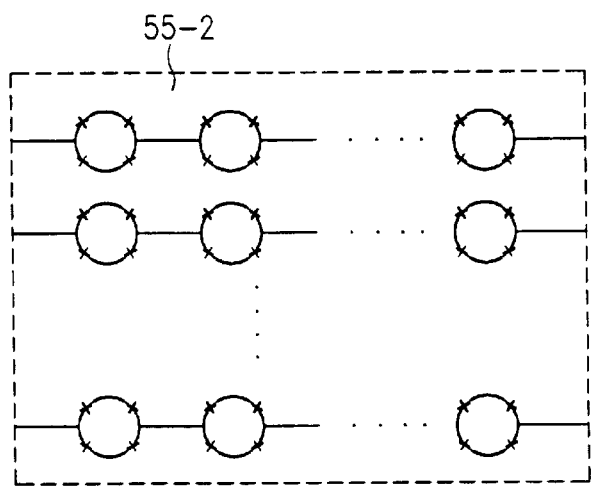
Figure 8C:
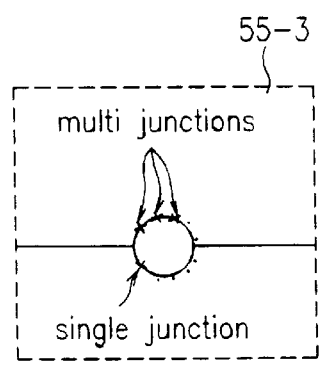

FIGS. 8B and 8C are the same concept as FIG. 8A except that the number of superconducting junctions within the loop of one superconducting quantum interference device 55-2 or 55-3 is four or more. The junctions may be positioned symmetrically about the loop, as shown in FIG. 8B, or asymetrically, such as with a single junction on one half and multi junctions on the other half, as shown in FIG. 8C. In each example, the output power and the impedance matching effect of the antenna can be more raised.

As noted above, the low frequency input signal is effectively transformed into the high frequency signal by using the magnetic-to-voltage multiplex characteristic of the superconducting quantum interference device. Hence, a signal of hundreds of MHz bands having high frequency stability can be frequency-multiplied to a microwave and a millimeter wave. The inventive high frequency signal generator using the superconducting quantum interference device can be used as a local oscillating signal in a signal processor using the high frequency signal. In particular, it is very useful as the local oscillating signal of a transmitting/receiving end of the microwave and millimeter wave radio communication system operated at a low temperature for a low noise characteristic. Furthermore, a variety of clock signals can be utilized in a digital integrated circuit of a superconducting device and a semiconductor device operated at a low temperature.

In the inventive high frequency signal generator using the superconducting quantum interference device, a plurality of superconducting quantum interference devices may be used, and a waveguide type of FIG. 6 or a substrate type of FIG. 7 may be constructed. Therefore, it will be understood by those skilled in the art that foregoing and other changes in form and details may be made without departing from the spirit and scope of the invention. Thus, it is intended that the present invention cover the modifications and variations of this invention provided they come within the scope of the appended claims and their equivalents.

What is claimed is:

1. A high frequency signal generator for generating a high frequency signal according to a low frequency input current, said high frequency signal generator comprising:
   a coil for receiving said low frequency input current and generating a low frequency magnetic signal;
   a back short part for passing said low frequency magnetic signal generated from said coil, and cutting off a high frequency signal generated from a superconducting quantum interference device array part which includes a plurality of superconducting quantum interference devices combined at least one of in series and in parallel;

said superconducting quantum interference device array part for respectively receiving said low frequency magnetic signal and a bias current from said back short part and a bias current supply wire, and generating said high frequency signal corresponding to a waveform, amplitude and frequency of said low frequency magnetic signal; and an upper waveguide part for cutting off said low frequency magnetic signal generated from said coil, and transmitting only said high frequency signal to an outside of said high frequency signal generator.

2. A high frequency signal generator as claimed in claim 1, wherein said superconducting quantum interference device array part includes said plurality of superconducting quantum interference devices arranged in a plurality of rows, and said high frequency signal generator further comprises:

antennas integral with said plurality of superconducting quantum interference devices for emitting each said high frequency signal generated from said plurality of superconducting quantum interference devices to the outside of said high frequency signal generator;

high frequency chokes each with one end connected to a respective one of said antennas to prevent said high frequency signal generated from said plurality of superconducting quantum interference devices in one of said rows from flowing to the outside of said high frequency signal generator; and parallel connectors of a non-superconductor each connected in parallel to another end of a respective one of said high frequency chokes to supply said bias current to said plurality of superconducting quantum interference devices.

3. A high frequency signal generator as claimed in claim 2, wherein said coil converts said low frequency input current to said magnetic signal.

4. A high frequency signal generator as claimed in claim 1, wherein said upper waveguide part has a step structure shape and comprises:

an upper waveguide;

an impedance matching part for impedance matching of said high frequency signal, said impedance matching part being provided between said superconducting quantum interference device array part and said upper waveguide; and a guide path for cutting off said low frequency magnetic signal generated from said coil of a bottom waveguide and sending only said high frequency signal generated from said superconducting quantum interference device array part to the outside of said high frequency signal generator.

5. A high frequency signal generator as claimed in claim 1, further comprising a back short position adjuster for adjusting a distance between said back short part and said superconducting quantum interference device array part.

6. A high frequency signal generator as claimed in claim 1, wherein said superconducting quantum interference device array part is positioned between a bottom waveguide and said upper waveguide part and installed in an interference device supporter.

7. A high frequency signal generator as claimed in claim 6, wherein said bottom waveguide has a step structure at an upper side of said bottom waveguide so as to install said interference device supporter.

8. A high frequency signal generator as claimed in claim 1, further comprising a bottom waveguide part for supporting and protecting said coil, said back short part and said superconducting quantum interference device array part.

* * * * *